United States Patent
Kwak

(10) Patent No.: US 7,890,835 B2
(45) Date of Patent: Feb. 15, 2011

(54) CYCLIC REDUNDANCY CHECK CIRCUIT AND COMMUNICATION SYSTEM HAVING THE SAME FOR MULTI-CHANNEL COMMUNICATION

(75) Inventor: Jae-Young Kwak, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 1319 days.

(21) Appl. No.: 11/376,278

(22) Filed: Mar. 15, 2006

(65) Prior Publication Data
US 2007/0079211 A1 Apr. 5, 2007

(30) Foreign Application Priority Data
Sep. 12, 2005 (KR) .................. 10-2005-0084550

(51) Int. Cl.
*H03M 13/00* (2006.01)
(52) U.S. Cl. .................. 714/758; 714/746; 714/776
(58) Field of Classification Search ................ 714/758, 714/746, 776, 757, 786; 370/536; 375/267
See application file for complete search history.

(56) References Cited

U.S. PATENT DOCUMENTS

| | | | |
|---|---|---|---|
| 5,426,654 A | 6/1995 | Hayashi et al. | |
| 5,523,813 A * | 6/1996 | Manabe et al. | 396/436 |
| 5,935,269 A | 8/1999 | Kodama | 714/781 |
| 6,061,822 A | 5/2000 | Meyer | |
| 6,324,669 B1 | 11/2001 | Westby | |
| 6,732,318 B2 * | 5/2004 | Collier et al. | 714/758 |
| 6,961,388 B2 * | 11/2005 | Ling et al. | 375/267 |
| 7,424,040 B2 * | 9/2008 | Walden | 370/536 |
| 2004/0062221 A1 | 4/2004 | Gopalakrishnan et al. | |
| 2004/0120411 A1 * | 6/2004 | Walton et al. | 375/260 |

FOREIGN PATENT DOCUMENTS

| | | |
|---|---|---|
| JP | 2005-6188 | 1/2005 |
| KR | 10-0268125 | 7/2000 |

* cited by examiner

*Primary Examiner*—Fritz Alphonse
(74) *Attorney, Agent, or Firm*—F. Chau & Associates, LLC

(57) ABSTRACT

A method of implementing and manufacturing a cyclic redundancy check circuit for a multi-channel communication system. The method includes creating a generation expression that generates cyclic redundancy check (CRC) bits that satisfies a cyclic redundancy check polynomial of a mono-channel serial communication system with respect to a first point in time, creating a generation expression with respect to points in time that are sequentially delayed as much as the number of multi-channels from the first point in time by applying each point in time to the generation expression, and embodying a circuit corresponding to the generation expression with respect to the most delayed point in time among the created generation expressions. The CRC circuit corresponding to the generation expression will have more modulo-2 adders (e.g., XOR gates) than the number of non-zero coefficients in the selected CRC polynomial.

16 Claims, 3 Drawing Sheets

US 7,890,835 B2

CYCLIC REDUNDANCY CHECK CIRCUIT AND COMMUNICATION SYSTEM HAVING THE SAME FOR MULTI-CHANNEL COMMUNICATION

CROSS-REFERENCE TO RELATED PATENT APPLICATIONS

This application claims the priority, under 35 U.S.C. §119, of Korean Patent Application No. 10-2005-0084550, filed on Sep. 12, 2005, in the Korean Intellectual Property Office, which is incorporated herein in its entirety by reference.

BACKGROUND OF THE INVENTION

1. Field of the Invention

The present invention relates to a cyclic redundancy check (CRC) circuit and a communication system having the same, and more particularly, to a cyclic redundancy check (CRC) circuit and a communication system having the same in a multi-channel serial communication system such as a high definition multimedia interface (HDMI).

2. Description of the Related Art

HDMI is a cable and interface for transmitting uncompressed digital audio and video data between an audio/video source such as a set-top box (e.g., a cable box, of a satellite receiver) or a DVD player and a display such as a digital TV. HDMI supports standard high definition video and multi-channel audio and all ATSC (advanced television systems committee) HDTV standards and 8 channel digital audio, through a single cable and only one connector at each end (a mini-plug with 19-poles). HDMI transfers audio data frequencies up to 192 kHz with a word width up to 24 bit on up to 8 channels. The band width for video data is at up to 165 MHz. Therefore it is possible to transmit all picture and sound formats of the home cinema world—including HDTV (up to the highest resolution of 1080p)—without any loss of quality.

The Cyclic Redundancy Check is a way to detecting small changes in blocks of transmitted data and was originally developed for detection of line transmission errors. CRC (cyclic redundancy check) is an error detection method to certify reliability of transmitted/received data in serial data transmission systems and the principles of its operation are as follows. First, when a word of n-bit data is shifted by k bits and the k-shifted n-bit data is divided by a predetermined (preset) k-bit key (polynomial) value, an r-bit remainder is left. At a transmission end (of the serial data transmission system), the r-bit remainder is appended to the original n-bits, to produce (n+r) bits of data that is transmitted. At a receiving end (of the serial data transmission system), the (n+r) bits of received data is divided by the key value and, if the remainder is 0, it is determined that the received data has no error.

The CRC algorithm operates on a block or frame of data as a unit (e.g., a single large numerical value). The CRC algorithm divides this large value by a predetermined number (the CRC polynomial or generator polynomial P), leaving the remainder, which is the r-bit CRC result. The CRC result can be sent or stored along with the original data. When the data is received (or recovered from storage) the CRC algorithm can be reapplied, and the latest result compared to the original result. If an error has occurred, there will probably be a different CRC result. Most uses of CRC do not attempt to classify or locate the error (or errors), but simply arrange to repeat the data operation until no errors are detected.

The quality of generated r-bit CRC as the reminder after division is mainly influenced by the chosen generator polynomial. The selection of generator polynomial is the most important part of implementing the CRC algorithm. The polynomial is chosen to maximize the error detecting capabilities. When creating a new polynomial, general advice is to use an irreducible polynomial (over modular arithmetics), which means that the polynomial cannot be divided by any polynomial (except itself) with zero remainder. The specific CRC is defined by the polynomial P used. A degree-k polynomial, has the form $1+x \ldots +x^k$. This is naturally expressed as an k+1 bit string, but the highest ($x^k$) term is normally implicit, leaving a k-bit string.

The CRC polynomial expression P(x) defined by the HDMI standard has an order (k) of eight, and is shown below in Equation 1.

$$P(x)=1+x^6++x^7+x^8 \quad \text{[Equation 1]}$$

The process of generating the r CRC bits according to the HDMI CRC polynomial expression of Equation 1 is described below.

FIG. 2 is a block diagram of a conventional CRC circuit configured to implement the CRC polynomial expression of Equation 1. The CRC circuit of FIG. 2 is configured for processing serial data transmitted and received through a general mono-channel serial communication system. The symbol $\oplus$ represents an XOR gate or modulo-2 adder. The CRC circuit includes a plurality (r, up to or equal to, but not more than, the order k of the polynomial) of modulo-2 adders 41 and a plurality (k, e.g., k=8 for HDMI) of flip-flops 42 for delaying the input data. The r bits of the CRC output by the circuit of FIG. 2 correspond to r taps P[0], P[5], and P[6].

CRCs are based on division of polynomials over integers modulo-2. In this modular arithmetic, coefficients of polynomials are represented by only one bit. Any string of bits can be interpreted as a sequence of polynomial coefficients. The CRC algorithm treats all bit streams as binary polynomials. Any string of bits (data) can be interpreted as the coefficients of a polynomial of this sort, and to find the CRC, we divide the data by another fixed polynomial P. This pre-defined polynomial is called the devisor or CRC Polynomial. The coefficients of the remainder polynomial are the CRC. The CRC is defined as a sequence of coefficients appearing in the remainder polynomial.

Modulo-2 arithmetic allows an efficient implementation of a form of division that is fast, easy to implement, and sufficient for the purposes of error detection. Addition and subtraction operations are equivalent in modulo-2 arithmetic and both are the same as the XOR (Exclusive OR) function for bits, so it's very simple to implement in hardware. There are no carries between the bits and computing of all basic operations is less computational expensive than in normal arithmetic. That is the reason why the modular arithmetic is used.

A summary of the CRC creation process is as follows:
1. Get the n-bit data.
2. Left shift the n-bit data (by k bits) and the divide it by P.
3. The r-bit reminder of the last action is the CRC.
4. Append the first r-bit CRC to the data and transmit them together as a data frame.

And a summary of the CRC check process is as follows:
1. Receive the data frame.
2. Divide it (e.g., the n bits of data) by P.
3. Compare the second r-bit CRC with the transmitted first r-bit CRC.

The conventional hardware CRC implementation (circuit) is shown in FIG. 2. Thus, the shift register of FIG. 2 (comprised of k flip flops 42) contains k bits, equal to the length (order) of the Polynomial (Equation 1). In the conventional CRC circuit, there are up to k (but no more than k) XOR gates.

The presence or absence of an XOR gate corresponds to the presence or absence of a term in the divisor polynomial P.

A CRC circuit that is identical to the CRC circuit at the transmission end is provided at the receiving end. The CRC circuit at the receiving end generates r CRC bits from the n-bits of transmitted/received data and determines the existence of an error by comparing the r generated CRC bits and the r received (e.g., transmitted) CRC bits.

In a mono-channel serial communication system, such as a universal serial bus (USB), CRC bits are instantly generated when the transmission of serial data is completed real time. However, in a multi-channel serial communication system such as HDMI, since multiple data are transmitted simultaneously in parallel through multiple channels, there is a need to generate CRC bits suitable for the multi-channel transmission.

SUMMARY OF THE INVENTION

While the conventional CRC circuit includes only r modulo-2 adders (corresponding to the r bits of the CRC, where r is up to or equal to, but not more than, the order k of the polynomial) the CRC circuits according to various embodiments of the invention include more than r modulo-2 adders.

An aspect of the present invention provides a cyclic redundancy check (CRC) circuit that can process data in parallel in a multi-channel serial communication. Another aspect of the present invention provides a (multi-channel) communication system having the cyclic redundancy check (CRC) circuit.

According to an aspect of the present invention, a cyclic redundancy check circuit for multi-channel serial communication is manufactured according to a method comprising: creating a first generation expression that generates cyclic redundancy check bits and that satisfies a cyclic redundancy check polynomial of a mono-channel serial communication system with respect to a first point in time, creating a second generation expression with respect to points in time that are sequentially delayed, by the number of multi-channels, from the first point in time (e.g., by substituting each point in time to the first generation expression), and embodying a circuit corresponding to the second generation expression.

According to another aspect of the present invention, a transmitting circuit comprises a plurality of storing units configured to store data that is input in parallel, a cyclic redundancy check circuit configured to receive data in parallel from the storing units and to generate cyclic redundancy check bits, and a transmission circuit configured to transmit the data in parallel from the storing units and the cyclic redundancy check bits through the multi-channel.

According to another aspect of the present invention, a receiving circuit comprises a plurality of storing units configured to store parallel data that is received with first cyclic redundancy check bits through a multi-channel, a cyclic redundancy check circuit configured to receiving the parallel data and to generate second cyclic redundancy check bits, and a determination portion configured to determine the detection of an error (e.g., an error generated in the multi channel) (e.g., by comparing the first cyclic redundancy check bits with the second cyclic redundancy check bits).

According to another aspect of the present invention, a communication system comprising a transmitter and a receiver. The transmitter includes a plurality of first storing units configured to store data that in parallel, a first cyclic redundancy check circuit configured to input data in parallel from the storing units and to generate first cyclic redundancy check bits from the parallel data, a transmission circuit configured to transmit data in parallel from the storing units through a multi-channel and, when the data is transmitted, to transmit the first cyclic redundancy check bits through the multi-channel. The receiver includes a plurality of second storing units configured to store the parallel data that is received through the multi-channel, a second cyclic redundancy check circuit configured to receive the parallel data and to generate second cyclic redundancy check bits from (based on) the parallel data; and a determination portion configured to determine the detection of an error (e.g., an error generated in the multi channel), e.g., by comparing the first cyclic redundancy check bits with the second cyclic redundancy check bits.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EXEMPLARY EMBODIMENTS OF THE INVENTION

Figure 1:
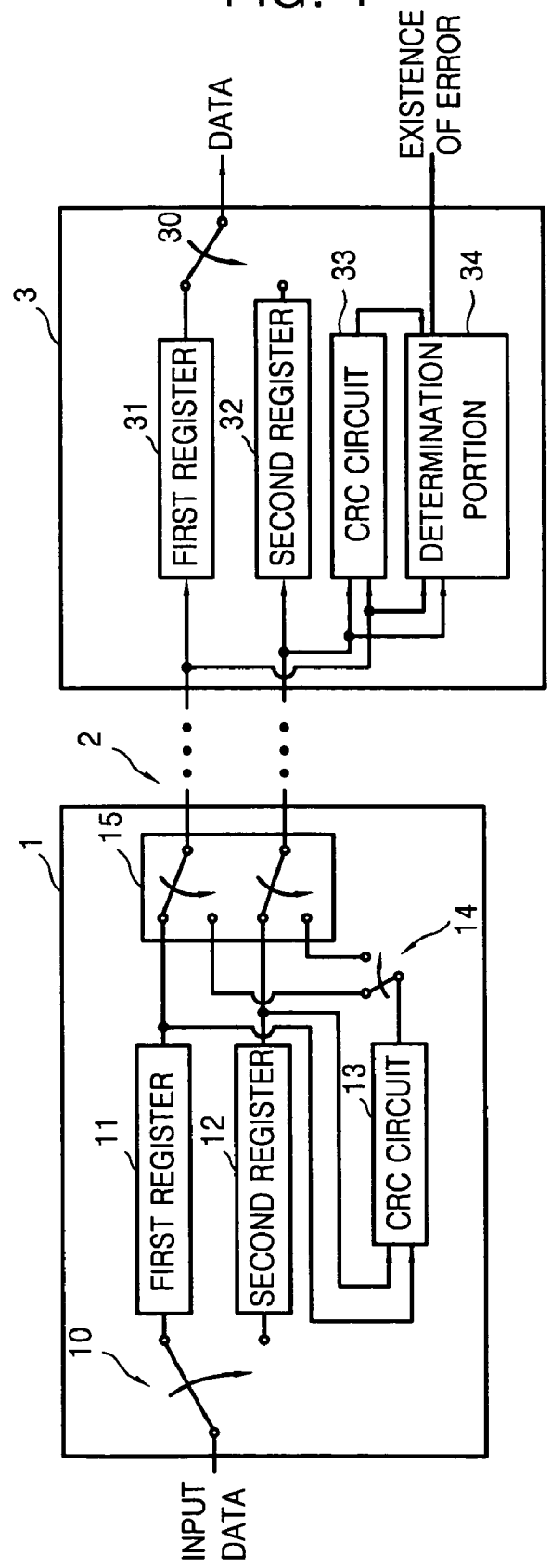
FIG. 1 is a block diagram of a communication system that transmits through multiple channels including a cyclic redundancy check circuit according to an embodiment of the present invention.

FIG. 1 is a block diagram of a communication system that communicates (transmits and receives) through a multi-channel (through multiples channels) including a cyclic redundancy check circuit according to an embodiment of the present invention. The system of FIG. 1 includes a transmission circuit (transmitter) 1 and a receiving circuit (receiver) 3. The transmission circuit 1 transmits data to a receiving circuit 3 through a multi-channel 2. Although the multi-channel 2 has only two channels (for the convenience of simpler explanation), the present invention is not limited thereto and can be extended to any multiple number of channels.

The transmission circuit 1 includes a first register 11, a second register 12, a cyclic redundancy check (CRC) circuit 13, a switch 14, and a switching portion (multiplexer) 15. The transmission circuit 1 may further include a switch 10 to convert input serial data to parallel data. For the convenience of explanation, the switch 10 and the switch 14 are referred to a first switch and a second switch, respectively.

The first and second registers 11 and 12 store input data. When the input data is serial data, the first switch 10 stores the input data either in the first register 11 or in the second register 12 by switching the order of inputting the input data so as to make parallel transmission possible. The first and second registers 11 and 12 are shift registers that shift the stored data at every clock cycle. The data output from the first register 11 or from the second register 12 is transmitted to the receiving circuit 3 through the multiple channels of the multi-channel 2 in parallel.

The data output from the first register 11 or from the second register 12 is also output to the CRC circuit 13. The CRC circuit 13 generates CRC bits suitable for a communication (transmitting and receiving the received data) between the transmission circuit 1 and the receiving circuit 3. The CRC bits are transmitted through the second switch 14 in the same order as the data.

The switch portion (multiplexer) 15 connects the first and second registers 11 and 12 to the multi-channel 2 so that the data is transmitted in parallel. When the CRC bits are generated, the switch portion (multiplexer) 15 connects the output of the CRC circuit 13 (connected via the second switch 14), to the multi-channel 2.

The receiving circuit (receiver) 3 includes a first register 31, a second register 32, a CRC circuit 33, and a determination portion 34. The receiving circuit 3 may further include a switch 30 that converts the parallel data output from the first and second registers 31 and 32 into serial data. If necessary, the switch 30 converts the parallel data output from the first and second registers 31 and 32 to serial data and outputs the serial data.

The first and second registers 31 and 32 store the data received from the first and second channels, respectively, of the multi-channel 2. The first and second registers 31 and 32 are shift registers that sequentially shift input data and output the shifted data.

The CRC circuit 33 of the receiving circuit (receiver) 3 is the same as the CRC circuit 13 of the transmission circuit (transmitter) 1 and generates CRC bits from the transmitted (n+r) bit data received through the multi-channel 2. The determination portion 34 checks whether the r CRC bits received through the multi-channel 2 is identical to the r CRC bits generated by the CRC circuit 33. When the CRC bits are determined as identical, the determination portion 34 determines and outputs a signal indicating that no error exists.

Figure 2:
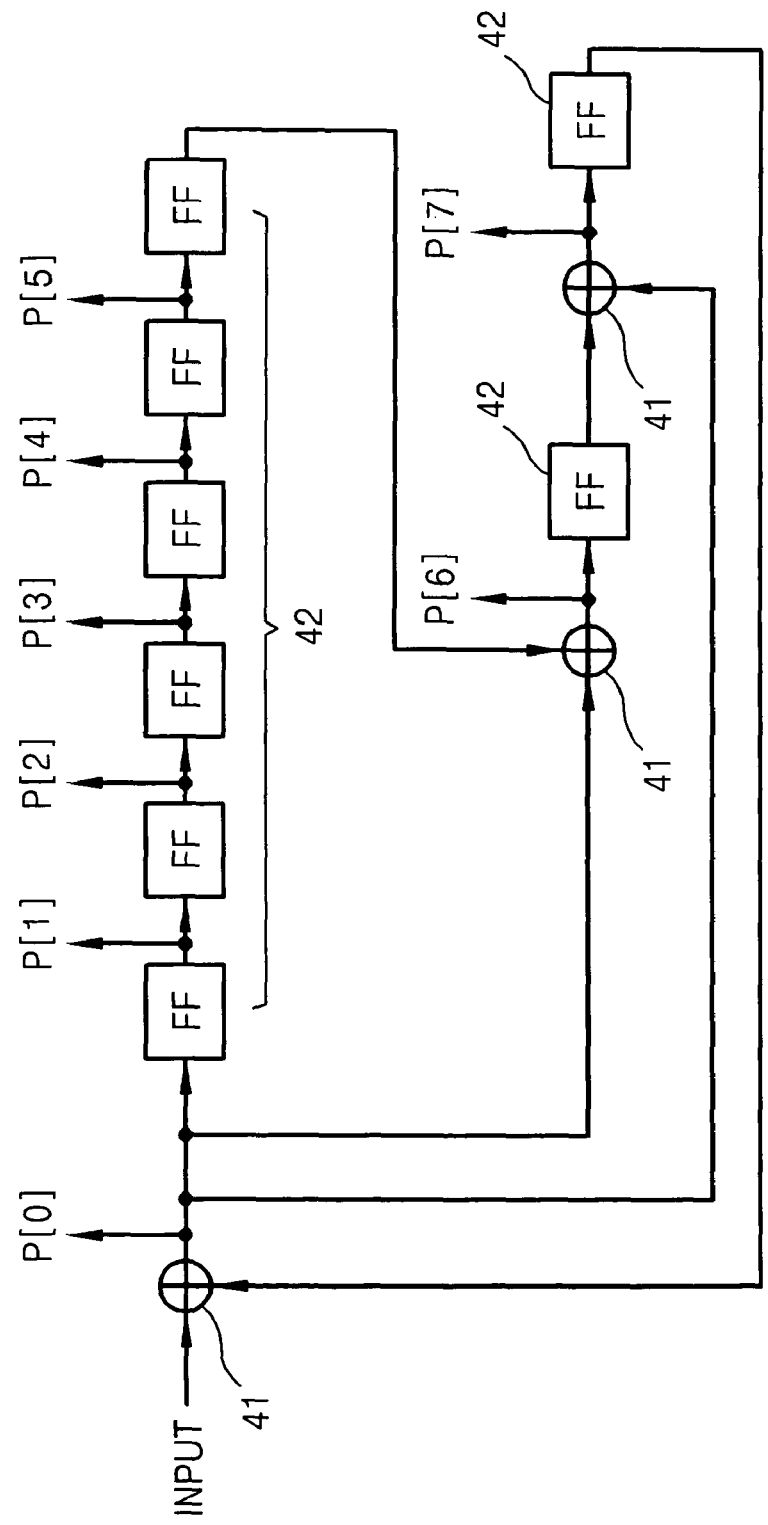
FIG. 2 is a circuit diagram of a conventional cyclic redundancy check circuit configured according to a cyclic redundancy check polynomial expression of a high definition multimedia interface (HDMI)

In the present embodiment, each of the CRC circuit 13 of the transmission circuit 1 and the CRC circuit 33 of the receiving circuit 3 generates r CRC bits according to a CRC polynomial expression of HDMI (Equation 1). The current output at the first tap of the conventional CRC circuit of FIG. 2 (expressed herein as $p[0](t)$) is equal to the current (time t) input (expressed here as Input(t)) plus the prior output of the last (eighth) tap (expressed here as $p[7](t-1)$). Thus, $p[0](t)$ =Input(t)$\oplus$p[7](t-1). The current (time t) output of each of the CRC circuit's other taps may be expressed in a similar fashion. Thus, a generation expression for generating each of the (final) CRC bits according to the above circuit of FIG. 2 at the current (t-th) clock cycle is shown in Equation 2 below:

$p[0](t)=\text{Input}(t)\oplus p[7](t-1)$ $p[1](t)=p[0](t-1)$ $p[2](t)=p[1](t-1)$ $p[3](t)=p[2](t-1)$ $p[4](t)=p[3](t-1)$ $p[5](t)=p[4](t-1)$ $p[6](t)=p[5](t-1)\oplus\text{Input}(t)\oplus p[7](t-1)$ $p[7](t)=p[6](t-1)\oplus\text{Input}(t)\oplus p[7](t-1)$ [Equation 2]

When final input data is input to the circuit, final CRC bits are generated according to Equation 2 and the r CRC bits generated at a transmission end are appended to n data bits and transmitted (in parallel) therewith.

In the present embodiment, since the transmission and receiving ends communicate with each other according to the HDMI standard, the data can be transmitted in parallel using two channels as shown in FIG. 1, and thus, 2 bits of data are transmitted in one clock cycle. Thus, there is a need to adapt the CRC circuit in the mono-channel serial communication system presumed in FIG. 2 to a multi-channel serial communication system.

To this end, in the present embodiment, the CRC bit generation expression of Equation 2 can be modified as follows. While the serial data is input one bit at a time, 2 bits of data are actually input in parallel at a single clock cycle in the parallel communication system such as HDMI.

The parallel input data maybe expressed as a sequence of data pairings, e.g., serial_in(t) and serial_in(t+1), according to the original (serial) order of the input data.

For example, when "0110" is input, at the first clock cycle, "0" and "1" are initially transmitted in parallel through the first and second channels respectively and, at the next clock cycle, "1" and "0" are transmitted in parallel through the first and second channels respectively. Thus, for the data input at the first clock cycle, "0" and "1" are respectively represented by serial_in(t) and serial_in(t+1), and when the new representation of input data is applied to Equation 2, the result is shown in Equation 3 below:

$p[0](t+1)=\text{serial\_in}(t)\oplus p[7](t)$ $p[1](t+1)=p[1](t)$ $p[2](t+1)=p[1](t)$ $p[3](t+1)=p[2](t)$ $p[4](t+1)=p[3](t)$ $p[5](t+1)=p[4](t)$ $p[6](t+1)=p[5](t)\oplus\text{serial\_in}(t+1)\oplus p[7](t)$ $p[7](t+1)=p[6](t)\oplus\text{serial\_in}(t+1)\oplus p[7](t)$ [Equation 3]

When Equation 2 is applied to Equation 3, the result is shown in Equation 4 below.

$p[0](t+1)=\text{serial\_in}(t+1)\oplus p[6](t-1)\oplus\text{serial\_in}(t)\oplus p[7](t-1)$ $p[1](t+1)=\text{serial\_in}(t)\oplus p[7](t-1)$ $p[2](t+1)=p[0](t-1)$ $p[3](t+1)=p[1](t-1)$ $p[4](t+1)=p[2](t-1)$ $p[5](t+1)=p[3](t-1)$ $p[6](t+1)=p[4](t-1)\oplus\text{serial\_in}(t+1)\oplus p[6](t-1)\oplus\text{serial\_in}(t)\oplus p[7](t-1)$ $p[7](t+1)=p[5](t-1)\oplus\text{serial\_in}(t+1)\oplus p[6](t-1)$ [Equation 4]

Figure 3:
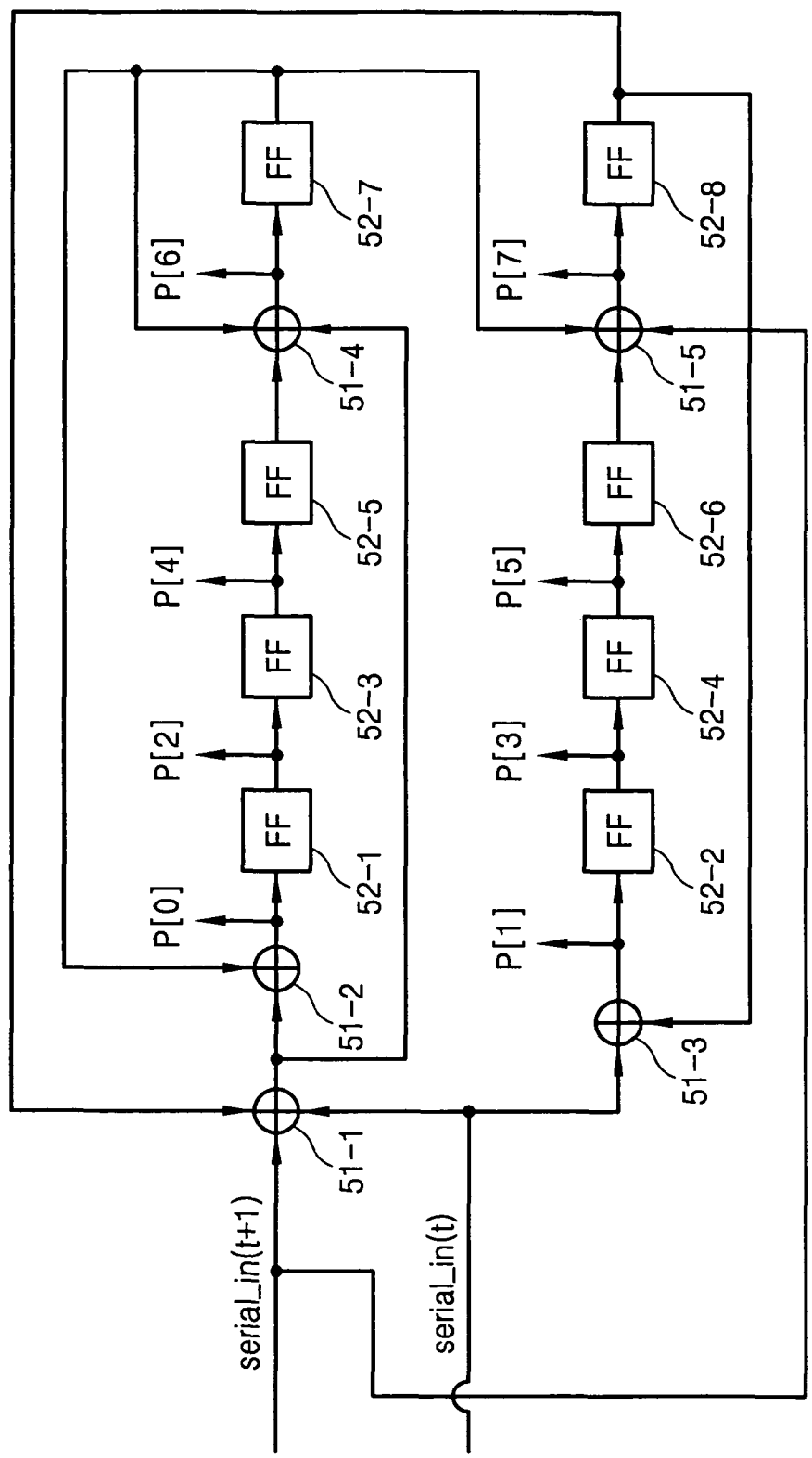
FIG. 3 is a circuit diagram of a cyclic redundancy check circuit configured according to an embodiment of the present invention.

FIG. 3 shows a CRC circuit according to an embodiment of the present invention. Referring to FIG. 3, the CRC circuit embodies and implements Equation 4. Thus, a CRC bit generation (polynomial) expression (Equation 1) is embodied in hardware with respect to the time that is delayed (here, t+1) relative to the input parallel data.

As shown in FIG. 3, the CRC circuit includes a plurality of modulo-2 adders 51-1 through 51-5 and a plurality of delay units (e.g., flip-flops) 52-1 through 52-8 for data delay.

The CRC circuit shown in FIG. 3 is described in further detail below. The CRC circuit of FIG. 3 generates and outputs first through eighth tap bits P[0] through P[7] that constitute the CRC bits. For this purpose, the CRC circuit includes the first through fifth exclusive logic sum operators 51-1 through 51-5 and the first through eighth delay units (e.g., flip-flops) 52-1 through 52-8.

The first exclusive logic sum operator 51-1 performs exclusive logic sum of the first and second channel data serial_in(t) and serial_in(t+1) and an eighth delay bit and outputs the exclusively logic summed data. The eighth delay bit is an output signal of the eighth delay unit (e.g., flip-flop) 52-8, that is, a delayed signal of the eighth tap bit P[7].

The second exclusive logic sum operator 51-2 performs exclusive logic sum of an output signal of the first exclusive logic sum operator 51-1 and a seventh delay bit to generate a first tap bit P[0]. The seventh delay bit is an output signal of the seventh flip-flop 52-7, that is, a delay signal of the seventh tap bit P[6].

The third exclusive logic sum operator 51-3 performs exclusive logic sum of the first channel data serial_in(t) and the eighth delay bit, that is, the output signal of the eighth flip-flop 52-8, to generate a second tap bit P[1].

The first flip-flop 52-1 delays the first tap bit P[0] to generate the third tap bit P[2]. The second flip-flop 52-2 delays the second tap bit P[1] to generate the fourth tap bit P[3]. The third flip-flop 52-3 delays the third tap bit P[2] to generate the fifth tap bit P[4]. The fourth flip-flop 52-4 delays the fourth tap bit P[3] to generate the sixth tap bit P[5]. The fifth flip-flop 52-5 delays the fifth tap bit P[4] to generate the fifth delay bit. The sixth flip-flop 52-6 delays the sixth tap bit P[5] to generate the sixth delay bit.

The fourth exclusive logic sum operator 51-4 performs exclusive logic sum of the output signal of the first exclusive logic sum operator 51-1, the fifth delay bit, and the seventh delay bit to generate the seventh tap bit P[6]. The fifth exclusive logic sum operator 51-5 performs exclusive logic sum of the sixth delay bit (the output signal of the sixth flip-flop 52-6), the seventh delay bit (the output signal of the seventh flip-flop 52-7), and the second channel data (serial_in(t+1)) to generate the eighth tap bit P[7].

Since the above calculation circuit architecture can be adapted to any given CRC polynomial and to all multi-channel serial communication systems, even as the number of data input in parallel increases, gate delay due to the modulo-2 adders increases while the calculation can be practically performed within an allowable range.

In the conventional mono-channel serial communication system, since the conventional CRC circuit has only one input, under a multichannel communication environment in which a plurality of inputs are simultaneously generated, data to be processed first is processed while the other data is stored and processed later, at a higher (serial) clock frequency. However, since data within each clock cycle is transmitted in parallel, the amount of data being stored increases as time passes so that the storage capacity of a data storing unit needs to be increased. Also, when the same clock as that used in the mono-channel serial communication environment is used for the multi-channel communication, the time to process data increases as much as the number of the multiple channels so that the CRC is processed quite later than a point when the data transmission is completed.

However, according to the architecture of the exemplary CRC circuit shown in FIG. 3, since the resultant expression obtained by first executing a mathematical calculation is embodied into a CRC circuit, the parallel processing of parallel inputs to the CRC circuit is made possible and the above-mentioned storage unit is not needed so that the size of the entire circuit is reduced and the time delay generated during communication can be reduced or removed.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, since a resultant expression obtained by first executing a mathematical calculation is embodied into a CRC circuit, the parallel processing of parallel inputs by a CRC circuit is made possible and a storage unit for storing the data input in parallel is not needed so that the size of the entire circuit is reduced and the time delay generated during communication can be removed. In the claims and the disclosure above, the term "modulo-2 adder" of course designates and means and includes its known alternatives and equivalents, such as a modulo-2 adder, a modulo-2 subtractor and an exclusive-OR (XOR) gate.

What is claimed is:

1. A cyclic redundancy check circuit for multi-channel communication comprising a bit generation circuit configured to generate cyclic redundancy check bits that satisfy a cyclic redundancy check polynomial of a mono-channel serial communication system with respect to a first point in time and that embodies circuit elements corresponding to a generation expression with respect to points in time that are sequentially delayed by as much as the number of multi-channels from the first point in time by applying each point in time to the generation expression.

2. The cyclic redundancy check circuit of claim 1, wherein the circuit comprises a plurality of modulo-2 adders and a plurality of delay units that delay input data for a clock cycle.

3. A cyclic redundancy check circuit for multi-channel communication configured to receive data in parallel, and to process the received data in parallel, and to generate cyclic redundancy check bits based on the received data,
wherein the cyclic redundancy check circuit comprises a bit generation circuit that generates the cyclic redundancy check bits that satisfy a cyclic redundancy check polynomial of a mono-channel serial communication system with respect to a first point in time, and that provides the cyclic redundancy check bits based upon data that is delayed from the first point in time by a number of clock cycles that correspond to the number of multi-channels.

4. A cyclic redundancy check circuit of claim 3, wherein the circuit comprises a plurality of modulo-2 adders and a plurality of delay units that delay input data for a clock cycle.

5. A communication system comprising:
a plurality of storing units configured to store data in parallel;
a cyclic redundancy check circuit configured to receive data output in parallel from the storing units and to generate cyclic redundancy check bits; and
a transmission circuit configured to transmit data output in parallel from the storing units and the cyclic redundancy check bits through the multi-channel,
wherein the cyclic redundancy check circuit comprises a bit generation circuit that generates the cyclic redundancy check bits that satisfy a cyclic redundancy check polynomial of a mono-channel serial communication system with respect to a first point in time, and that provides the cyclic redundancy check bits based upon data that is delayed from the first point in time by a number of clock cycles that correspond to the number of multi-channels.

6. The communication system of claim 5, wherein the cyclic redundancy check circuit comprises a plurality of modulo-2 adders and a plurality of delay units that delay input data for a clock cycle, and the modulo-2 adders and the delay units are connected according to the generation expression.

7. The communication system of claim 5, wherein the cyclic redundancy check circuit is configured to generate first through eighth tap bits constituting the cyclic redundancy check bits, and the cyclic redundancy check circuit comprises:
- a plurality of flip-flops configured to delay the seventh and eighth tap bits and to generate seventh and eighth delay bits;
- a first modulo-2 adder configured to perform exclusive logic sum of the first and second channel data and the eighth delay bit;
- a second modulo-2 adder configured to perform exclusive logic sum of an output signal of the first modulo-2 adder and the seventh delay bit to generate the first tap bit;
- a third modulo-2 adder configured to perform exclusive logic sum of the first channel data and the eighth delay bit to generate the second tap bit;
- a flip-flop configured to delay the first tap bit and to generate the third tap bit;
- a flip-flop configured to delay the second tap bit and to generate the fourth tap bit;
- a flip-flop configured to delay the third tap bit and to generate the fifth tap bit;
- a flip-flop configured to delay the fourth tap bit and generate the sixth tap bit;
- a flip-flop configured to delay the fifth tap bit and to generate a fifth delay bit;
- a flip-flop configured to delay the sixth tap bit and to generate a sixth delay bit;
- a fourth modulo-2 adder configured to perform exclusive logic sum of an output signal of the first modulo-2 adder, the fifth delay bit, and the seventh delay bit to generate the seventh tap bit; and
- a fifth modulo-2 adder configured to perform exclusive logic sum of the sixth delay bit, the seventh delay bit, and the second channel data to generate the eighth tap bit.

8. A communication system comprising:
- a plurality of storing units configured to store parallel data that is received with first cyclic redundancy check bits through a multi-channel;
- a cyclic redundancy check circuit configured to receive the parallel data and to generate second cyclic redundancy check bits based on the parallel data; and
- a determination portion configured to determine the detection of an error by comparing the first cyclic redundancy check bits with the second cyclic redundancy check bits generated by the cyclic redundancy check circuit,
- wherein the cyclic redundancy check circuit comprises a bit generation circuit that generates the cyclic redundancy check bits that satisfy a cyclic redundancy check polynomial of a mono-channel serial communication system with respect to a first point in time, and that provides the cyclic redundancy check bits based upon data that is delayed from the first point in time by a number of clock cycles that correspond to the number of multi-channels.

9. The communication system of claim 8, wherein the circuit comprises a plurality of modulo-2 adders and a plurality of delay units that delay input data for a clock cycle, and the modulo-2 adders and the delay units are connected according to the generation expression.

10. The communication system of claim 8, wherein the cyclic redundancy check circuit is configured to generate first through eighth tap bits constituting the cyclic redundancy check bits, and the cyclic redundancy check circuit comprises:
- a plurality of flip-flops configured to delay the seventh and eighth tap bits and to generate seventh and eighth delay bits;
- a first modulo-2 adder configured to perform exclusive logic sum of the first and second channel data and the eighth delay bit;
- a second modulo-2 adder configured to perform exclusive logic sum of an output signal of the first modulo-2 adder and the seventh delay bit to generate the first tap bit;
- a third modulo-2 adder configured to perform exclusive logic sum of the first channel data and the eighth delay bit to generate the second tap bit;
- a flip-flop configured to delay the first tap bit and to generate the third tap bit;
- a flip-flop configured to delay the second tap bit and to generate the fourth tap bit;
- a flip-flop configured to delay the third tap bit and to generate the fifth tap bit;
- a flip-flop configured to delay the fourth tap bit and generate the sixth tap bit;
- a flip-flop configured to delay the fifth tap bit and to generate a fifth delay bit;
- a flip-flop configured to delay the sixth tap bit and to generate a sixth delay bit;
- a fourth modulo-2 adder configured to perform exclusive logic sum of an output signal of the first modulo-2 adder, the fifth delay bit, and the seventh delay bit to generate the seventh tap bit; and
- a fifth modulo-2 adder configured to perform exclusive logic sum of the sixth delay bit, the seventh delay bit, and the second channel data to generate the eighth tap bit.

11. A communication system comprising at least one of:
- a first cyclic redundancy check circuit configured to input parallel data and to generate first cyclic redundancy check bits based on the parallel data to be transmitted through a multi-channel; and
- a second cyclic redundancy check circuit configured to receive the parallel data received through a multi-channel and to generate second cyclic redundancy check bits based on the received parallel data
- wherein the first cyclic redundancy check circuit and the second cyclic redundancy check circuit each provide a bit generation circuit that generates the cyclic redundancy check bits that satisfy a cyclic redundancy check polynomial of a mono-channel serial communication system with respect to a first point in time, and that provides the cyclic redundancy check bits based upon data that is delayed from the first point in time by a number of clock cycles that correspond to the number of multi-channels.

12. The communication system of claim 11, further comprising:
- a determination portion operatively coupled to the second cyclic redundancy check circuit and configured to determine the detection of an error in the received parallel data by comparing the first cyclic redundancy check bits with the second cyclic redundancy check bits.

13. A multi-channel serial communication system comprising:
- a cyclic redundancy check circuit configured to receive first and second channel data in parallel and to generate cyclic redundancy check bits according to a predetermined generation expression; and a transmission circuit configured to transmit the first and second channel data in parallel and the cyclic redundancy check bits in parallel through the two channels, wherein the cyclic redundancy check circuit provides a bit generation circuit that generates the cyclic redundancy check bits that satisfy a cyclic redundancy check polynomial of a mono-channel serial communication system with respect to a first point in time, and that provides the cyclic redundancy check bits based upon data that is delayed from the first point in time by a number of clock cycles that correspond to the number of multi-channels.

14. A multi-channel serial communication system comprising:

a cyclic redundancy check circuit configured to receive first and second channel data in parallel and to generate cyclic redundancy check bits according to a predetermined generation expression; and a determination portion configured to determine the detection of an error by comparing first cyclic redundancy check bits received from a transmitting circuit with second cyclic redundancy check bits, wherein the cyclic redundancy check circuit provides a bit generation circuit that generates the cyclic redundancy check bits that satisfy a cyclic redundancy check polynomial of a mono-channel serial communication system with respect to a first point in time, and that provides the cyclic redundancy check bits based upon data that is delayed from the first point in time by a number of clock cycles that correspond to the number of multi-channels.

15. The multi-channel serial communication system of claim 14, wherein the cyclic redundancy check polynomial in a mono-channel serial communication system is $P(x)=1+x^6++x^7+x^8$.

16. The multi-channel serial communication system of claim 15, wherein the cyclic redundancy check circuit generates first through eighth tap bits constituting the cyclic redundancy check bits, and the cyclic redundancy check circuit comprises:

a plurality of flip-flops configured to delay the seventh and eighth tap bits and to generate seventh and eighth delay bits;

a first modulo-2 adder configured to perform an exclusive logic sum of the first and second channel data and the eighth delay bit;

a second modulo-2 adder configured to perform exclusive logic sum of an output signal of the first modulo-2 adder and the seventh delay bit to generate the first tap bit;

a third modulo-2 adder configured to perform exclusive logic sum of the first channel data and the eighth delay bit to generate the second tap bit;

a flip-flop configured to delay the first tap bit and to generate the third tap bit;

a flip-flop configured to delay the second tap bit and to generate the fourth tap bit;

a flip-flop configured to delay the third tap bit and to generate the fifth tap bit;

a flip-flop configured to delay the fourth tap bit and to generate the sixth tap bit;

a flip-flop configured to delay the fifth tap bit and to generate a fifth delay bit;

a flip-flop configured to delay the sixth tap bit and to generate a sixth delay bit;

a fourth modulo-2 adder configured to perform exclusive logic sum of an output signal of the first modulo-2 adder, the fifth delay bit, and the seventh delay bit to generate the seventh tap bit; and a fifth modulo-2 adder configured to perform exclusive logic sum of the sixth delay bit, the seventh delay bit, and the second channel data to generate the eighth tap bit.

* * * * *